(12) United States Patent
Kim et al.

(10) Patent No.: US 7,633,325 B2
(45) Date of Patent: Dec. 15, 2009

(54) SIGNAL GENERATION APPARATUS FOR FREQUENCY CONVERSION IN COMMUNICATION SYSTEM

(75) Inventors: Hyun-Seok Kim, Gwacheon-Si (KR); Joon-Hyun Baek, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 80 days.

(21) Appl. No.: 12/075,320

(22) Filed: Mar. 11, 2008

(65) Prior Publication Data

US 2008/0238515 A1    Oct. 2, 2008

(30) Foreign Application Priority Data

Mar. 26, 2007   (KR) .................... 10-2007-0029324

(51) Int. Cl.
*H03H 11/16* (2006.01)
(52) U.S. Cl. .................................... 327/254
(58) Field of Classification Search ............... 327/231, 327/237, 238, 254, 255
See application file for complete search history.

(56) References Cited

U.S. PATENT DOCUMENTS

| | | | | |
|---|---|---|---|---|
| 6,054,883 A | * | 4/2000 | Ishihara | ...................... 327/255 |
| 6,356,131 B1 | * | 3/2002 | Kuwano | ...................... 327/255 |
| 6,560,449 B1 | | 5/2003 | Liu | ...................... 455/302 |
| 6,747,499 B2 | * | 6/2004 | Sanduleanu | ................. 327/238 |
| 7,116,728 B2 | | 10/2006 | McCune, Jr. | ................. 375/324 |

OTHER PUBLICATIONS

Korean Patent Application No. 1019990023981 to Choi et al., having Publication date of Jan. 15, 2001 (w/ English Abstract page).
Japanese Patent Application No. 09-069798 to Junya, having Publication date of Oct. 9, 1998 (w/ English Abstract page).

* cited by examiner

Primary Examiner—Jeffrey S Zweizig
(74) Attorney, Agent, or Firm—Monica H. Choi

(57) ABSTRACT

A signal generation apparatus includes a signal generation portion and a phase compensator. The phase compensator generates a phase error control signal that maintains a phase difference between the in-phase and quadrature-phase signals generated by the signal generation portion. The phase compensator includes an offset compensator and a delay compensator. The offset compensator is set to compensate for an offset voltage through the phase compensator. The delay compensator is set to compensate for a difference of delays through paths for the in-phase and quadrature-phase signals within the phase compensator.

20 Claims, 11 Drawing Sheets

SIGNAL GENERATION APPARATUS FOR FREQUENCY CONVERSION IN COMMUNICATION SYSTEM

BACKGROUND OF THE INVENTION

This application claims priority under 35 USC §119 to Korean Patent Application No. 2007-29324 filed on Mar. 26, 2007 in the Korean Intellectual Property Office, the disclosure of which is incorporated herein in its entirety by reference.

1. Field of the Invention

The present invention relates generally to communication systems, and more particularly, to a signal generation apparatus for generating in-phase and quadrature (I/Q) signals with compensation of offset voltage and phase delay in a phase compensator.

2. Background of the Invention

In general, a zero-IF structure and an image rejection structure in a receiver or transmitter of a communication system typically uses an in-phase signal (hereinafter, referred to as an "I signal") and a quadrature-phase signal (hereinafter, referred to as a "Q signal") that are desired to have a phase difference of about 90°. FIG. 1 shows a block diagram of a frequency converting apparatus 10 which may be used in a receiver or transmitter according to the prior art. Referring to FIG. 1, the frequency converting apparatus 10 includes a signal generation circuit 12, a first mixer 18, and a second mixer 20.

The signal generation circuit 12 generates the I signals Ip and In as differential signals and generates the Q signals Qp and Qn as differential signals. The signal generation circuit 12 includes a voltage control oscillator (VCO) 14 and an I/Q signal generator 16. The voltage control oscillator 14 generates differential oscillating signals In$^+$ and In$^-$. The I/Q signal generator 16 generates the differential I signals Ip and In and the differential Q signals Qp and Qn from the differential oscillating signals In$^+$ and In$^-$. The pair of signals Ip and Qp are desired to have a phase difference of 90°, and the pair of signals In and Qn are desired to have a phase difference of 90°.

The first mixer 18 mixes a wireless (i.e., radio frequency) input signal RFIN and at least one of the I signals Ip and In to generate an in-phase intermediate frequency signal IIF. The second mixer 20 mixes the wireless input signal RFIN and at least one of the Q signals Qp and Qn to generate a quadrature-phase intermediate frequency signal IQF. When the phase difference between the signals Ip and the Qp or the signals In and the Qn is not accurately maintained at 90°, an image rejection characteristic of each of the first and second mixers 18 and 20 may disadvantageously be deteriorated.

A plurality of phase compensators (not shown in FIG. 1) compensate for a phase difference between the In and Qn signals to be maintained at 90°. However, the phase difference between the Ip and Qp signals may not be accurately maintained at 90° because of an offset voltage and a phase delay in the phase compensator. For example, the phase delay may be due to differences through multiple transfer paths within the phase compensator.

In addition, the Ip and Qp signals or the In and Qn signals may not have an accurate phase difference of 90° from variable parameters such as the manufacturing process, a supply voltage, and temperature. Thus, a signal-to-noise ratio (SNR) is deteriorated, and consequently a receiving sensitivity of a receiver or a transmitting sensitivity of a transmitter in a communication system is deteriorated.

SUMMARY OF THE INVENTION

Accordingly, a phase compensator of a signal generation apparatus is calibrated for compensating for the offset voltage and the phase delay in the phase compensator.

A signal generation apparatus according to an aspect of the present invention includes a signal generation portion and a phase compensator. The signal generation portion generates in-phase and quadrature-phase signals. The phase compensator generates a phase error control signal that maintains a phase difference between the in-phase and quadrature-phase signals. The phase compensator includes an offset compensator and a delay compensator. The offset compensator is set to compensate for an offset voltage through the phase compensator. The delay compensator is set to compensate for a difference of delays through paths for the in-phase and quadrature-phase signals within the phase compensator.

In another embodiment of the present invention, the phase compensator includes first and second delay units, a switch portion, and a main controller. The first delay unit provides a first delay to the in-phase signal, and the second delay unit provides a second delay to the quadrature-phase signal. The main controller controls the switch portion to selectively couple or uncouple each of the in-phase and quadrature-phase signals to the first and second delay units depending on each of a plurality of modes of operation of the signal generation apparatus.

In an example embodiment of the present invention, the modes of operation include calibration of the delay compensator, calibration of the offset compensator, and normal operation of the phase compensator. In that case, the phase compensator further includes first, second, and third registers. The first register stores an offset control code determined during the calibration of the offset compensator, and the offset control code is used to compensate for the offset voltage through the phase compensator.

The second register stores a phase delay control code determined during the calibration of the delay compensator, and the phase delay control code is used to compensate for the difference of the delays through the paths for the in-phase and quadrature-phase signals within the phase compensator. The third register stores a phase error control code determined during normal operation of the phase compensator, and the phase error control code is used to maintain the phase difference between the in-phase and quadrature-phase signals.

In a further embodiment of the present invention, the delay compensator includes the first and second delay units, and the signal generation apparatus further includes a code controller that sets the phase delay control code for determining at least one of the first and second delays for minimizing the difference of the delays through the paths for the in-phase and quadrature-phase signals within the phase compensator.

In another embodiment of the present invention, the signal generation apparatus further includes a switch portion, a mixer, a low-pass filter, a differentiator, and a comparator. The switch portion selectively couples a same one of the in-phase and quadrature-phase signals through the first and second delay units during calibration of the delay compensator. The mixer mixes outputs from the first and second delay units to generate a mixed signal. The low-pass filter filters the mixed signal to generate a filtered signal. The differentiator differentiates the filtered signal to generate a differentiated signal. The comparator compares the differentiated signal to a desired delay level. The code controller adjusts the phase delay control code for determining at least one of the first and second delays until the differentiated signal is at the desired delay level.

In that case in an example embodiment of the present invention, the first and second delay units, the code controller, the switch portion, the mixer, the low-pass filter, the differentiator, and the comparator are disposed within the phase compensator.

In another embodiment of present invention, the offset compensator includes the first and second delay units and an offset compensation unit that adjusts a combination of signals from the first and second delay units according to the offset control code that is set to minimize an effect of the offset voltage through the first and second signal paths. In addition, such an offset compensator further includes a switch portion, a mixer, a low-pass filter, a comparator, and a code controller.

The switch portion uncouples the in-phase and quadrature-phase signals from the first and second delay units during calibration of the offset compensator. The mixer mixes outputs from the first and second delay units to generate a mixed signal. The offset compensation unit adjusts the mixed signal according to the offset control code to generate an offset compensated signal. The low-pass filter filters the offset compensated signal to generate a filtered signal. The comparator compares the filtered signal to a desired offset level. The code controller adjusts the offset control code until the filtered signal is at the desired offset level. In that case, the first and second delay units, the offset compensation unit, the switch portion, the mixer, the low-pass filter, the comparator, and the code controller are disposed within the phase compensator.

The signal generation apparatus according to another embodiment of the present invention includes the first and second delay units with the first and second delays set for minimizing the difference of the delay between the in-phase and quadrature-phase signals through the phase compensator. In that case, the signal generation apparatus also includes a switch portion, a mixer, an offset compensation unit, a low-pass filter, a comparator, and a code controller.

In that case, the switch portion couples the in-phase signal to the first delay unit and couples the quadrature-phase signal to the second delay unit for normal operation of the phase compensator. The mixer mixes outputs from the first and second delay units to generate a mixed signal. The offset compensation unit adjusts the mixed signal to generate an offset compensated signal for minimizing an effect of the offset voltage through the first and second delay units. The low-pass filter filters the offset compensated signal to generate a filtered signal. The comparator compares the filtered signal to a desired phase difference level. The code controller adjusts the phase error control signal for adjusting the phase difference between the in-phase and quadrature-phase signals until the filtered signal is at the desired phase difference level. In this case, the first and second delay units, the switch portion, the mixer, the offset compensation unit, the low-pass filter, the comparator, and the code controller are disposed within the phase compensator.

The signal generation apparatus according to another embodiment of the present invention includes an oscillator for generating an oscillating signal and includes a signal generation portion. The signal generation portion uses the oscillating signal to generate the in-phase and quadrature-phase signals having the phase difference according to the phase error control signal.

In this manner, the offset voltage and the phase delay through the paths for the in-phase and quadrature-phase signals within the phase compensator are compensated. With such correction for the offset voltage and the phase delay in the phase compensator, the in-phase and quadrature-phase signals are maintained to have a phase difference of 90°. The present invention may be used to particular advantage when the in-phase and quadrature-phase signals are used for frequency conversion of a radio frequency input signal in a communication system.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and/or function.

DETAILED DESCRIPTION OF THE INVENTION

The above drawings for illustrating preferred embodiments of the present invention are referred to in order to gain a sufficient understanding of the present invention, the merits thereof, and the objectives accomplished by the implementation of the present invention. Hereinafter, the present invention is described in detail by explaining preferred embodiments of the invention with reference to the attached drawings.

Figure 1:
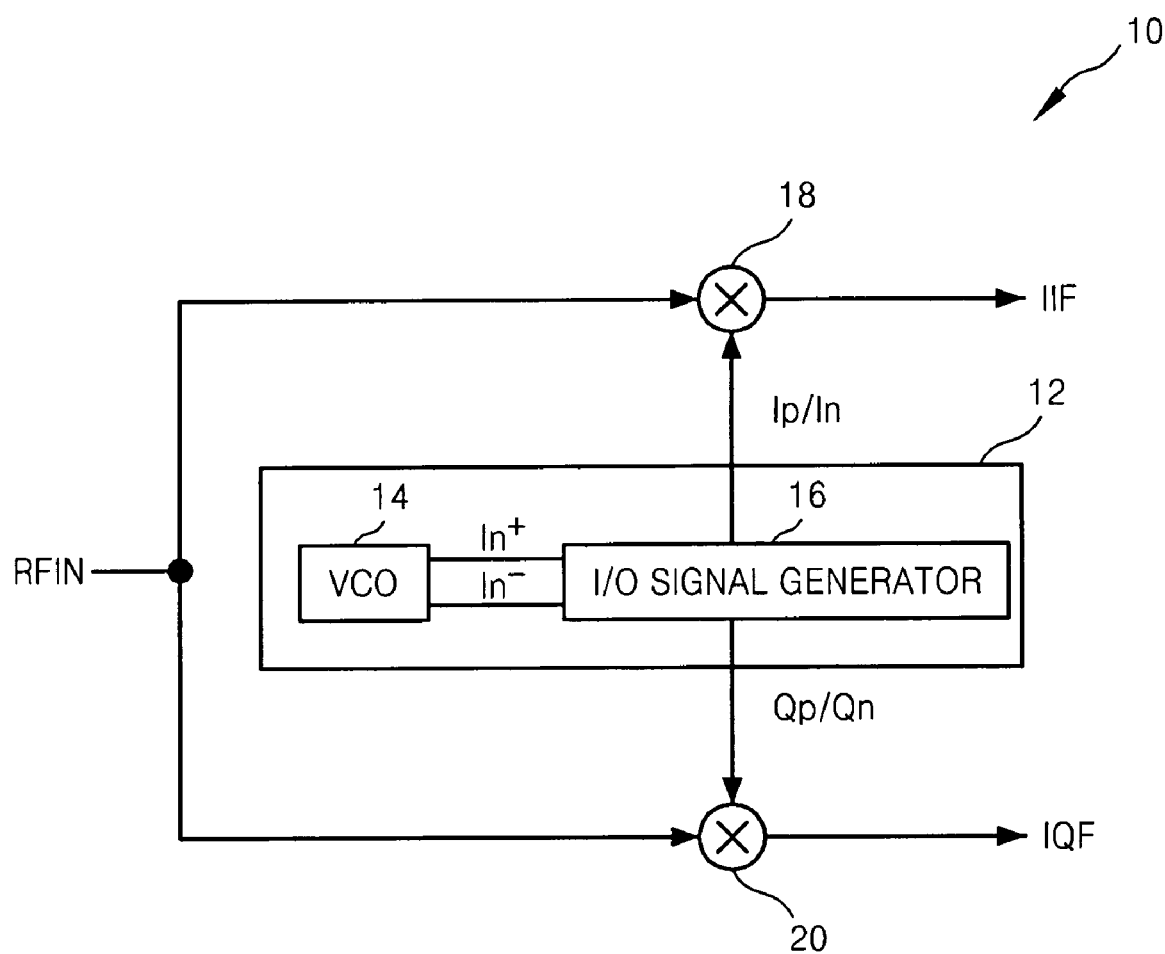
FIG. 1 is a block diagram of a frequency converting apparatus according to the prior art.
Figure 2:
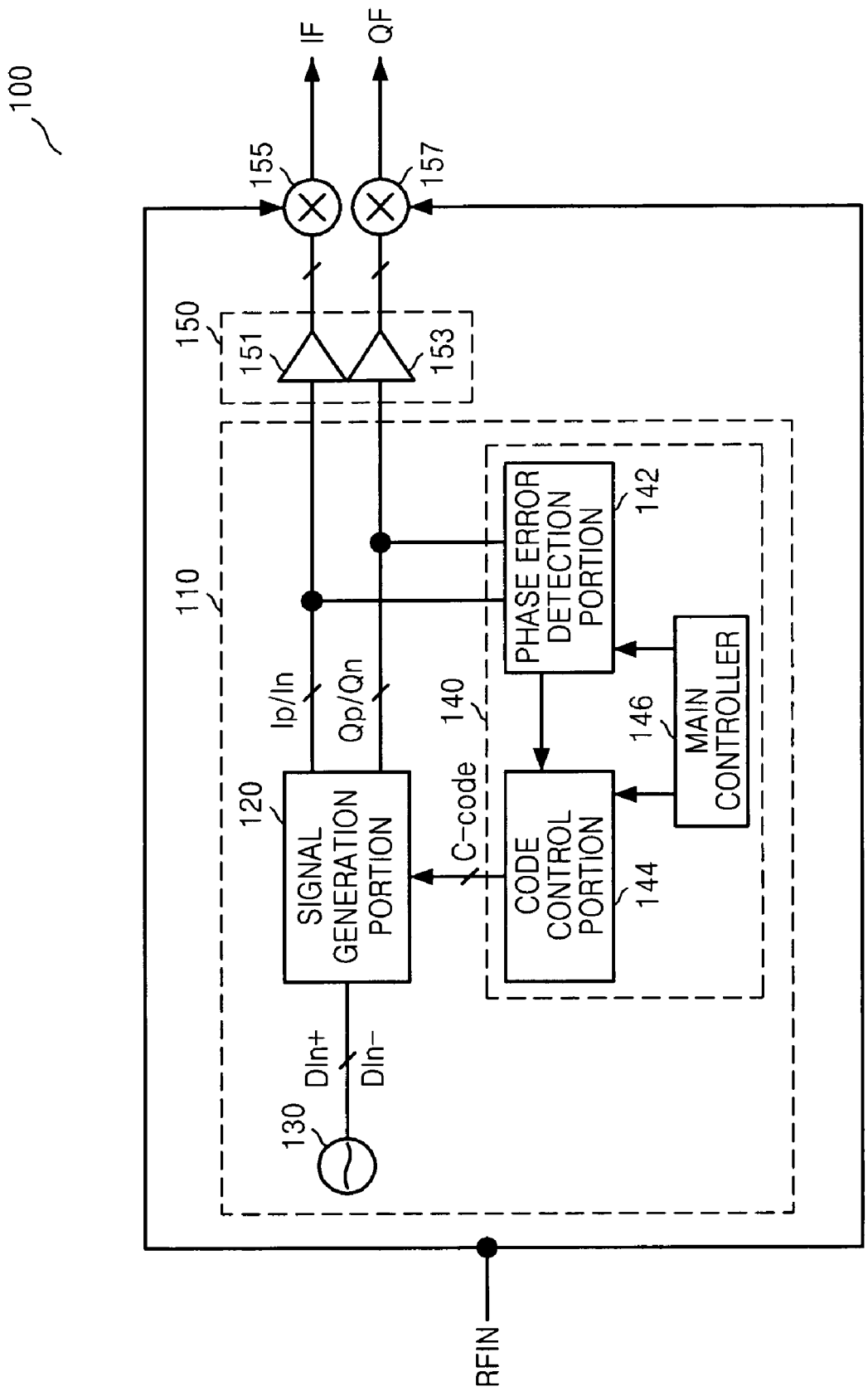
FIG. 2 is a block diagram of a frequency converting apparatus including a signal generation apparatus in a communication system, according to an embodiment of the present invention.
Figure 3:
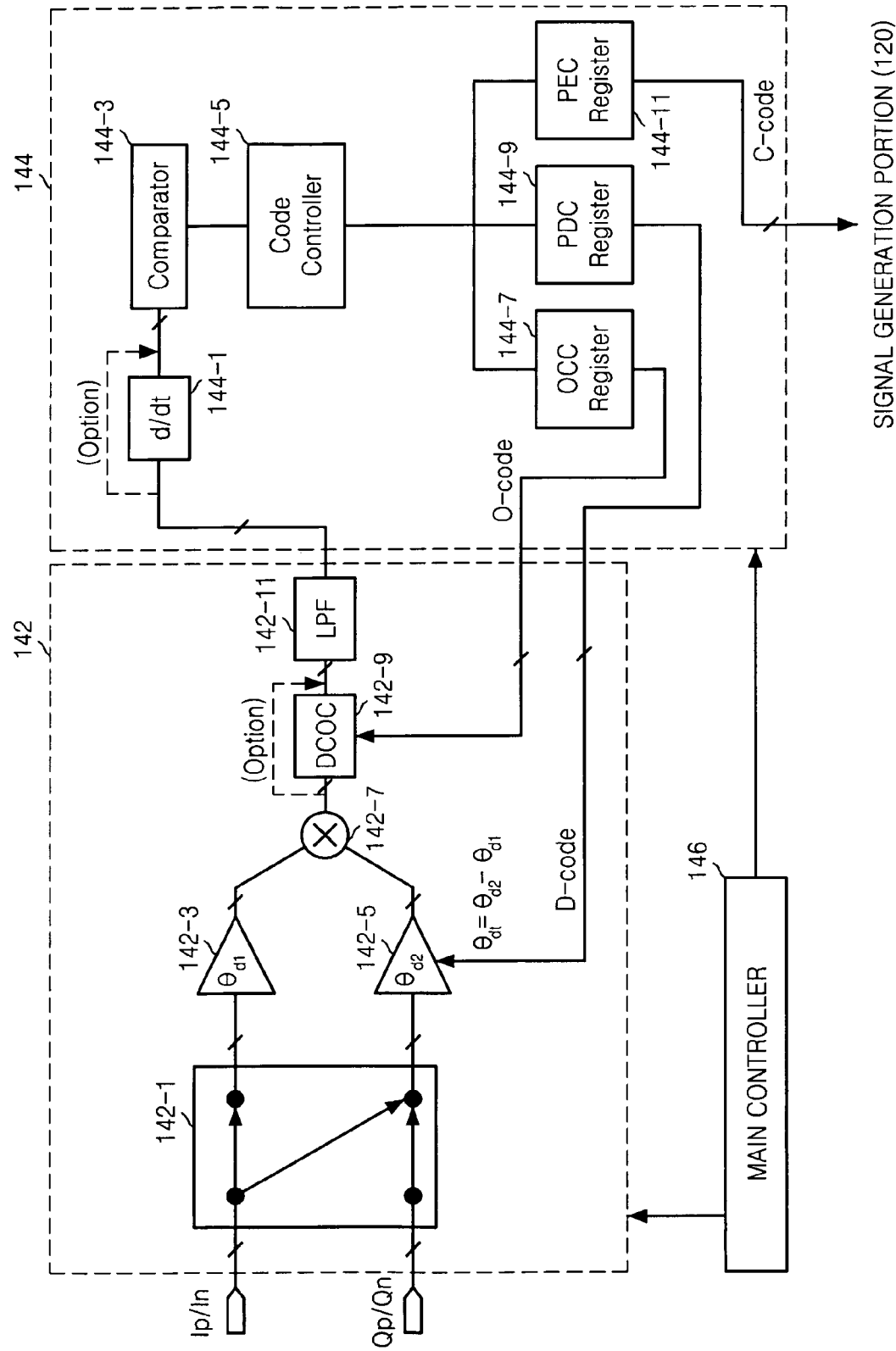
FIG. 3 is a block diagram of a phase compensator in the frequency converting apparatus of FIG. 2, according to an embodiment of the present invention.

FIG. 2 is a block diagram of a frequency converting apparatus 100 according to an embodiment of the present invention. The frequency converting apparatus 100 may be used in a receiver or a transmitter of a communication system for example. FIG. 3 is a block diagram of a phase compensator 140 of FIG. 2 according to an embodiment of the present invention.

Referring to FIGS. 2 and 3, the frequency converting apparatus 100 includes a signal generation apparatus 110, a buffer portion 150, a first mixer 155, and a second mixer 157. A receiver including the frequency converting apparatus 100 would include an antenna (not shown) that receives a radio frequency input signal RFIN.

The signal generation apparatus 110 generates at least one in-phase signal Ip and/or In and at least one quadrature-phase signal Qp and/or Qn. The in-phase signals Ip and In are differential signals with respect to each-other, and the quadrature-phase signals Qp and Qn are differential signals with respect to each-other.

The pair of in-phase and quadrature-phase signals Ip and Qp are desired to have a phase difference of 90°. The pair of in-phase and quadrature-phase signals In and Qn are desired to have a phase difference of 90°. The phases of the in-phase and quadrature-phase signals are set according to a phase error control code C-code for compensation of any phase error between at least one of the pair of in-phase and quadrature-phase signals Ip and Qp and the pair of in-phase and quadrature-phase signals In and Qn.

The signal generation apparatus 110 includes a signal generation portion 120, an oscillator 130, and a phase compensator 140. The signal generation portion 120 generates the differential in-phase signals Ip and In and the differential quadrature-phase signals Qp and Qn from differential oscillating signals Din+ and Din− generated by the oscillator 130. The present invention may also be practiced with a single ended in-phase signal I and a single ended quadrature-phase signal Q.

The buffer portion 150 includes a first buffer 151 and a second buffer 153. The first buffer 151 buffers the in-phase signal Ip and/or In from the signal generation portion 120, and the second buffer 153 buffers the quadrature-phase signal Qp and/or Qn from the signal generation portion 120. The first mixer 155 mixes the radio frequency input signal RFIN and at least one of the output signals of the first buffer 151 to generate an in-phase intermediate frequency signal IF. The second mixer 157 mixes the radio frequency input signal RFIN and at least one of the output signals of the second buffer 153 to generate a quadrature-phase intermediate frequency signal QF.

The oscillator 130 is a voltage controlled oscillator (VCO) according to an embodiment of the present invention, but the present invention is not limited thereto. The phase compensator 140 receives the in-phase signals Ip and In and the quadrature-phase signals Qp and Qn, detects a phase error between the in-phase and quadrature-phase signals to generate the C-code. Thus, the phase compensator 140 maintains the phase difference between the pair of in-phase and quadrature-phase signals In and Qn at about 90° and maintains the phase difference between the pair of in-phase and quadrature-phase signals Ip and Qp at about 90°.

The phase compensator 140 includes components that compensate for a DC offset voltage within the phase compensator 140 and a phase delay $\theta_{dt}$ of signal paths for the in-phase and quadrature-phase signals within the phase compensator 140. The phase compensator 140 includes a phase error detection portion 142, a code control portion 144, and a main controller 146.

The phase error detection portion 142 includes a switch portion 142-1, a delay portion comprised of a first delay unit 142-3 and a second delay unit 142-5, a mixer 142-7, an offset compensation portion 142-9, and a low pass filter 142-11. The code control portion 144 includes a differentiator 144-1, a comparator 144-3, a code controller 144-5, a first register 144-7, a second register 144-9, and a third register 144-11.

Figure 10:
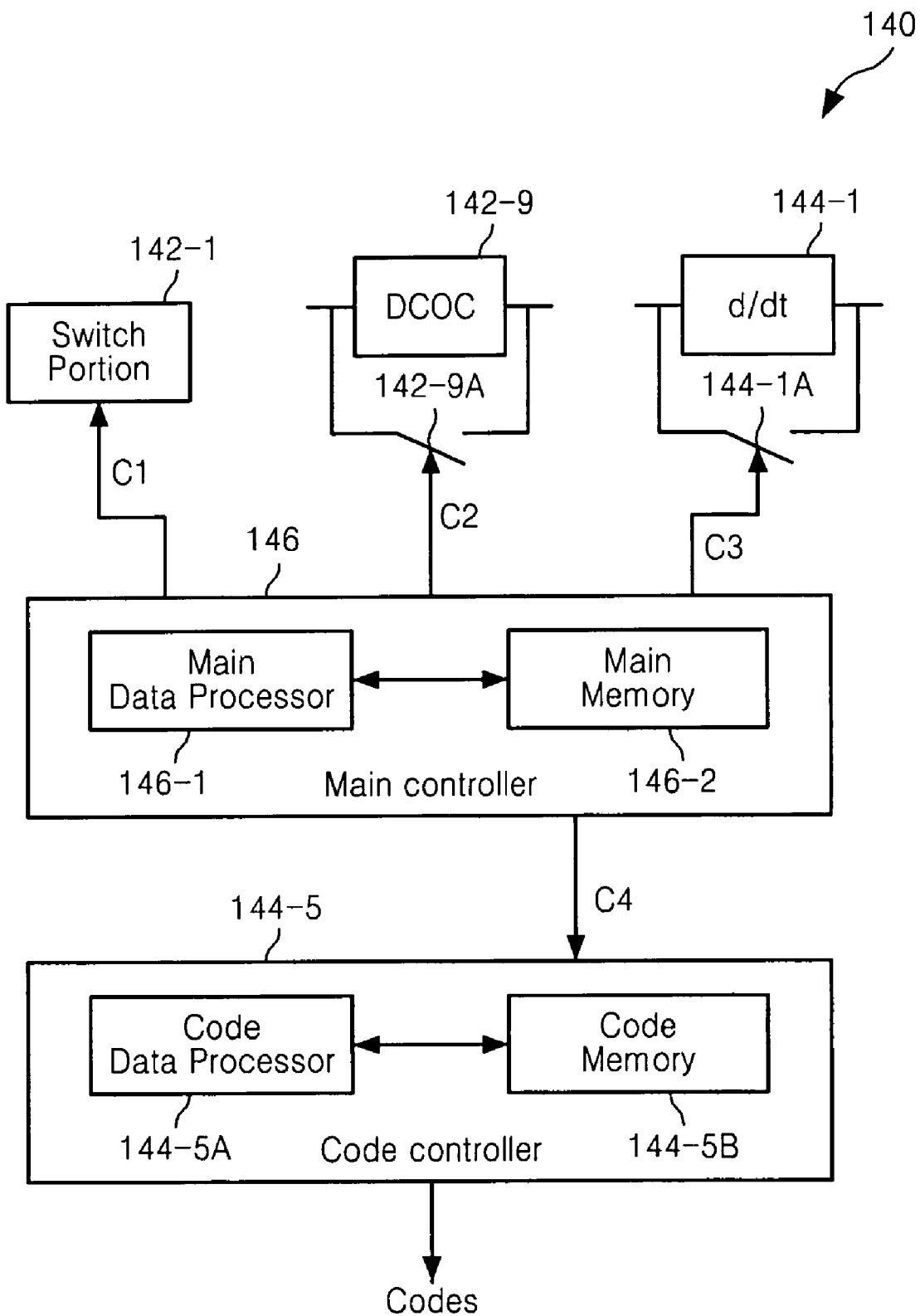
FIG. 10 shows a block diagram of a main controller and a code controller in the phase compensator of FIG. 3, according to an embodiment of the present invention.

Referring to FIG. 10, the main controller 146 includes a main data processor 146-1 and a main memory device 146-2 having sequences of instructions (i.e., software) stored therein. Execution of such sequences of instructions by the main data processor 146-1 causes the main data processor 146-1 to perform steps S51, S53, and S55 in the flow-chart of FIG. 11.

In such steps, the main controller 146 generates a first control signal C1 for controlling a configuration of the switch portion 142-1. The main controller 146 also generates a second control signal C2 for controlling a first by-pass switch 142-9A coupled to the offset compensation portion 142-9. The main controller 146 also generates a third control signal C3 for controlling a second by-pass switch 144-1A coupled to the differentiator 144-1.

Further referring to FIG. 10, the code controller 144-5 includes a code data processor 144-5A and a code memory device 144-5B having sequences of instructions (i.e., software) stored therein. Execution of such sequences of instructions by the code data processor 144-5A causes the code data processor 144-5A to perform steps S52, S54, and S56 in the flow-chart of FIG. 11 and steps S10, S20, S31, S33, S35, S41, S43, and S45 of FIG. 7.

Figure 4:
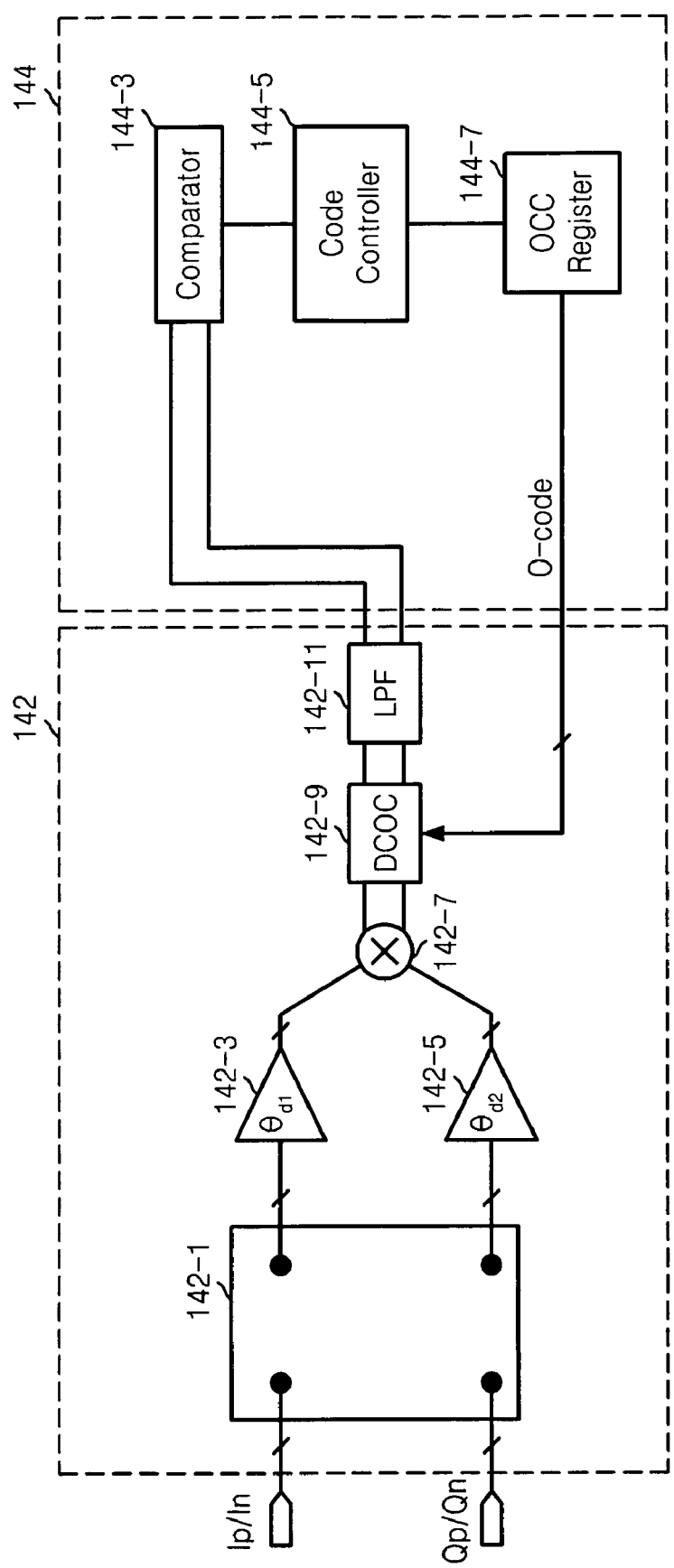
FIG. 4 is a block diagram showing configuration of the phase compensator of FIG. 3 during calibration of an offset compensator, according to an embodiment of the present invention.

Operation of the phase compensator 140 in the frequency converting apparatus 100 is now described. Referring to FIGS. 3, 4, 10, and 11, the main controller 146 configures the phase compensator 140 as illustrated in FIG. 4 for calibration of an offset compensator comprised of the offset compensation portion 142-9 (step S51 in FIG. 11). In that case, the main controller 146 generates the first control signal C1 for controlling the switch portion 142-1 to uncouple the in-phase signal Ip and/or In and the quadrature-phase signal Qp and/or Qn from the first and second delay units 142-3 and 142-5.

In addition, the main controller 146 generates the second control signal C2 for controlling the first bypass switch 142-9A to be open. Furthermore, the main controller 146 generates the third control signal C3 for controlling the second bypass switch 144-1A to be closed for bypassing the differentiator 144-1.

With such configuration of FIG. 4, the code controller 144-5 determines the offset control code O-code that compensates for the DC offset voltage in the phase compensator 140. With the in-phase signal Ip and/or In and the quadrature-phase signal Qp and/or Qn cut off by the switch portion 142-1, only the DC offset voltage of the phase compensator 140 are generated at the outputs of the first and second delay units 142-3 and 142-5.

The mixer 142-7 mixes outputs from the first and second delay units 142-3 and 142-5 to generate a mixed signal. The offset compensation portion 142-9 adjusts the mixed signal from the mixer 142-7 according to the offset control code O-code as stored in the first register 144-7 by the code controller to generate an offset compensated output. The low pass filter 142-11 performs low-pass filtering on the offset compensated output to generate a filtered signal that may be differential signals or complementary signals.

The comparator 144-3 compares the filtered signal to a desired offset level. The code controller 144-5 adjusts the offset control code O-code until the filtered signal is substantially at the desired offset level (step S52 of FIG. 11). When the filtered signal is substantially at the desired offset level, the DC offset voltage within the phase compensator 140 is satisfactorily compensated. The offset control code O-code, of N bits with N being a natural number, resulting in the filtered signal being substantially at the desired offset level is stored into the first register 144-7.

Figure 5:
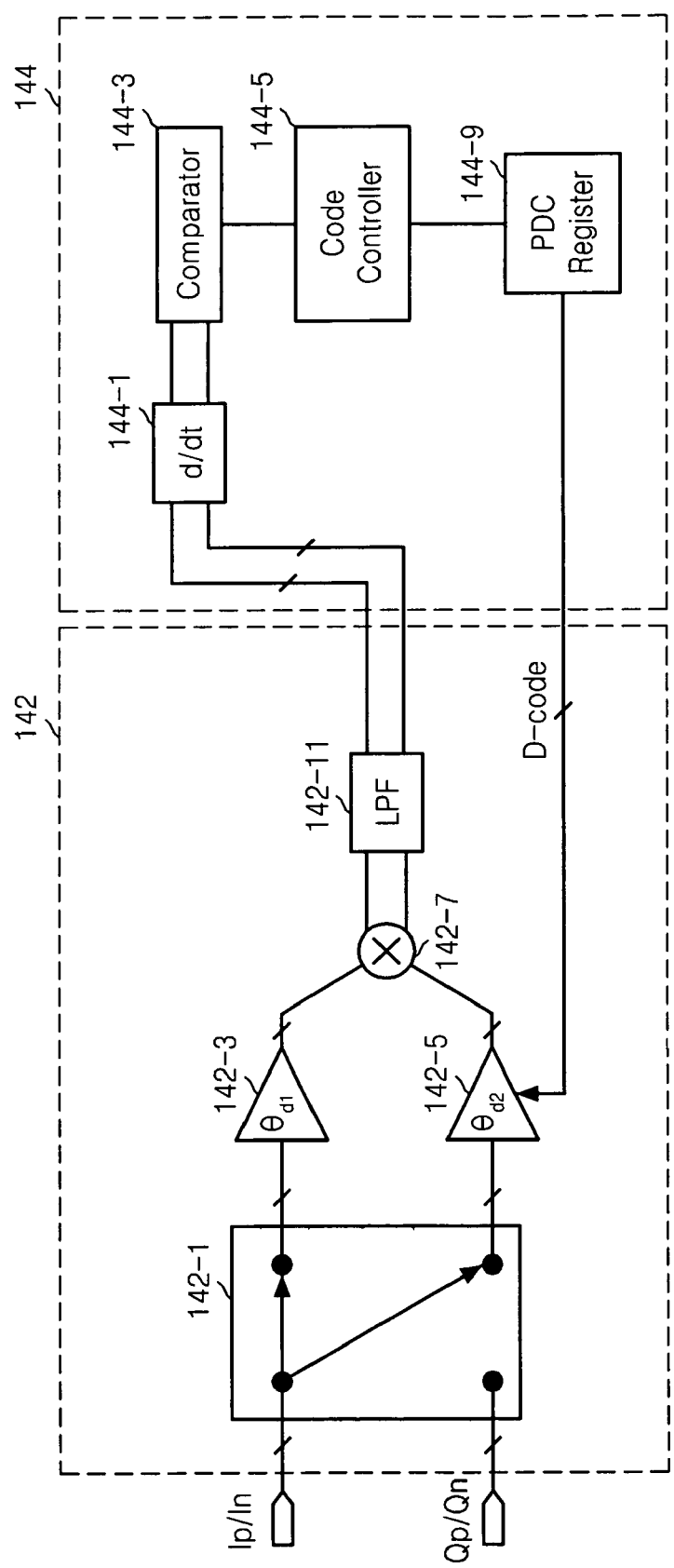
FIG. 5 is a block diagram showing configuration of the phase compensator of FIG. 3 during calibration of a phase delay compensator, according to an embodiment of the present invention.
Figure 11:
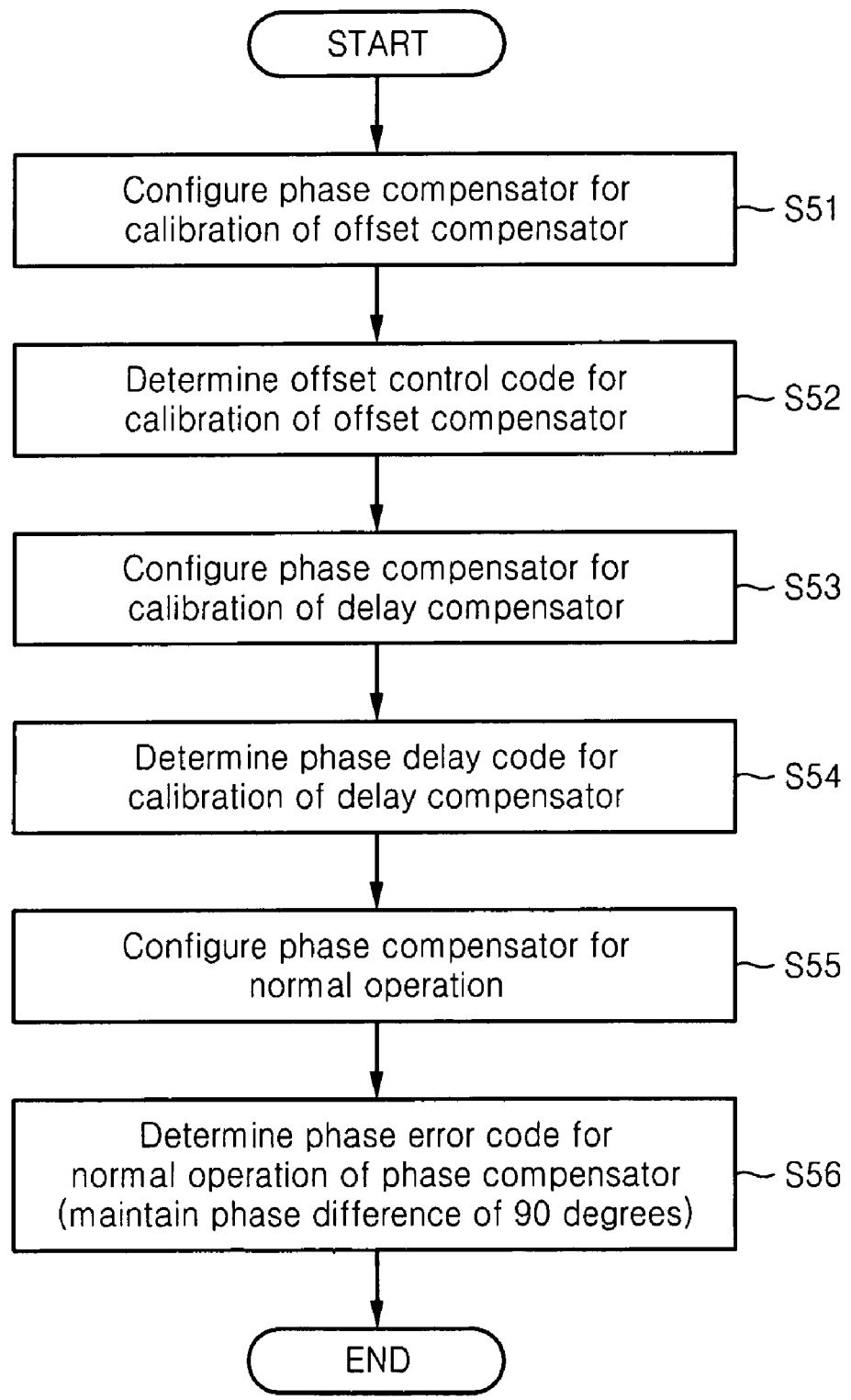
FIG. 11 shows a flowchart of steps during operation of the main controller and the code controller in FIG. 10, according to an embodiment of the present invention.

After calibration of the offset compensator 142-9, the main controller 146 configures the phase compensator 140 as illustrated in FIG. 5 for calibration of a delay compensator comprised of the first and second delay units 142-3 and 142-5 (step S53 in FIG. 11). In that case, the main controller 146 generates the first control signal C1 for controlling the switch portion 142-1 to couple just the selected in-phase signal Ip and/or In to both of the first and second delay units 142-3 and 142-5. During the calibration of the delay compensator, a selected one of the in-phase signal or the quadrature-phase signal is coupled to the first and second delay units 142-3 and 142-5.

In addition, the main controller 146 generates the second control signal C2 for controlling the first bypass switch 142-9A to be closed for bypassing the offset compensation portion 142-9. Furthermore, the main controller 146 generates the third control signal C3 for controlling the second bypass switch 144-1A to be open such that the differentiator 144-1 is used.

With such configuration of FIG. 5, the code controller 144-5 determines the phase delay control code D-code that compensates for a phase delay between the signal paths for the in-phase and quadrature phase signals (step S54 of FIG. 11). The first delay unit 142-3 is a first signal path that transmits the in-phase signal Ip and/or In, and the second delay unit 142-5 is a second signal path that transmits the quadrature-phase signal Qp and/or Qn.

Further referring to FIG. 5, the first delay unit 142-3 transmits the in-phase signal Ip and/or In with a first phase delay $\theta_{d1}$. The second delay unit 142-5 transmits the same in-phase signal Ip and/or In with a second phase delay $\theta_{d2}$. The mixer 142-7 mixes such outputs from the first and second delay units 142-3 and 142-5 to generate the mixed signal. The low pass filter 142-11 performs low-pass filtering on the mixed signal to generate a filtered signal.

The differentiator 144-1 differentiates the filtered signal to generate a differentiated signal. The comparator 144-3 compares the differentiated signal to a desired delay level. The code controller 144-5 adjusts the phase delay control code D-code until the differentiated signal is substantially at the desired delay level (step S54 of FIG. 11). In one embodiment of the present invention, the second delay unit 142-5 adjusts the second delay $\theta_{d2}$ according to the phase delay control code D-code.

When the differentiated signal is substantially at the desired delay level, the phase delay between the signals output from the first and second delay units 142-3 and 142-7 is minimized to a desired level. The phase delay control code D-code resulting in the differential signal being substantially at the desired delay level is stored into the second register 144-9.

The present invention may be practiced with at least one of the first and second phase delays $\theta_{d1}$ and $\theta_{d2}$ being adjusted according to the phase delay control code D-code. For example, at least one of the first and second phase delays $\theta_{d1}$ and $\theta_{d2}$ is a digitally controlled delay.

During calibration of the delay compensator, assume that the in-phase signal Ip and/or In transmitted to the first and second delay units 142-3 and 142-5 is expressed as cos(w·t). In addition, assume that the output of the first delay unit 142-3 is cos(w·t). In that case, the output of the second delay unit 142-5 is expressed as $\cos(w \cdot t + \theta_{dt})$, with $\theta_{dt} = \theta_{d2} - \theta_{d1}$.

Figure 6:
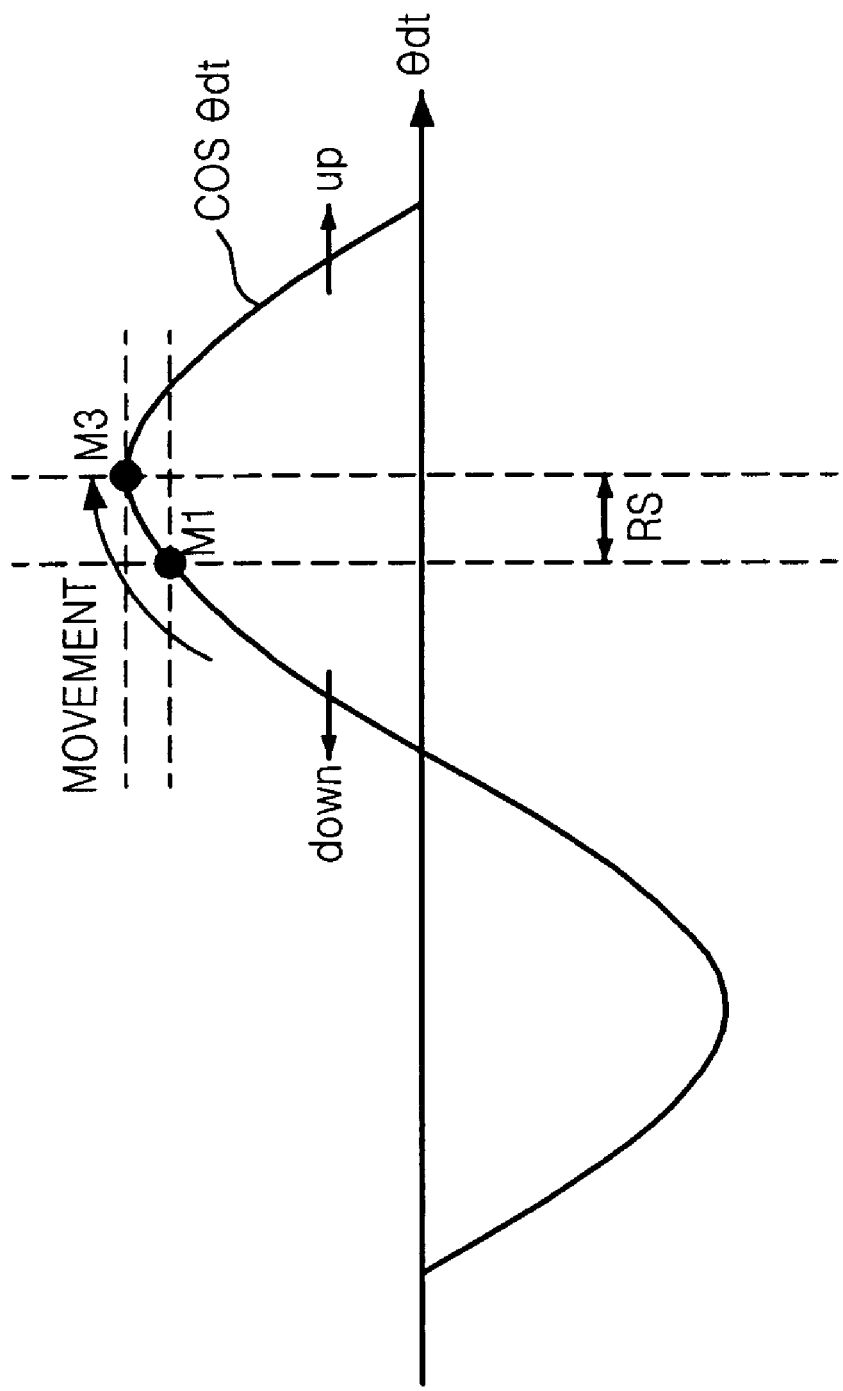
FIG. 6 shows an example functional plot used during calibration of the phase delay compensator in FIG. 5, according to an embodiment of the present invention.

Such outputs cos(w·t) and $\cos(w \cdot t + \theta_{dt})$ of the first and second delay units 142-3 and 142-5 are mixed by the mixer 142-7. The output of the mixer 142-7 is filtered by the low pass filter 142-11 to remove a high harmonic component such that the output of the low pass filter 142-11 is $\cos(\theta_{dt})$ as illustrated in FIG. 6.

Figure 7:
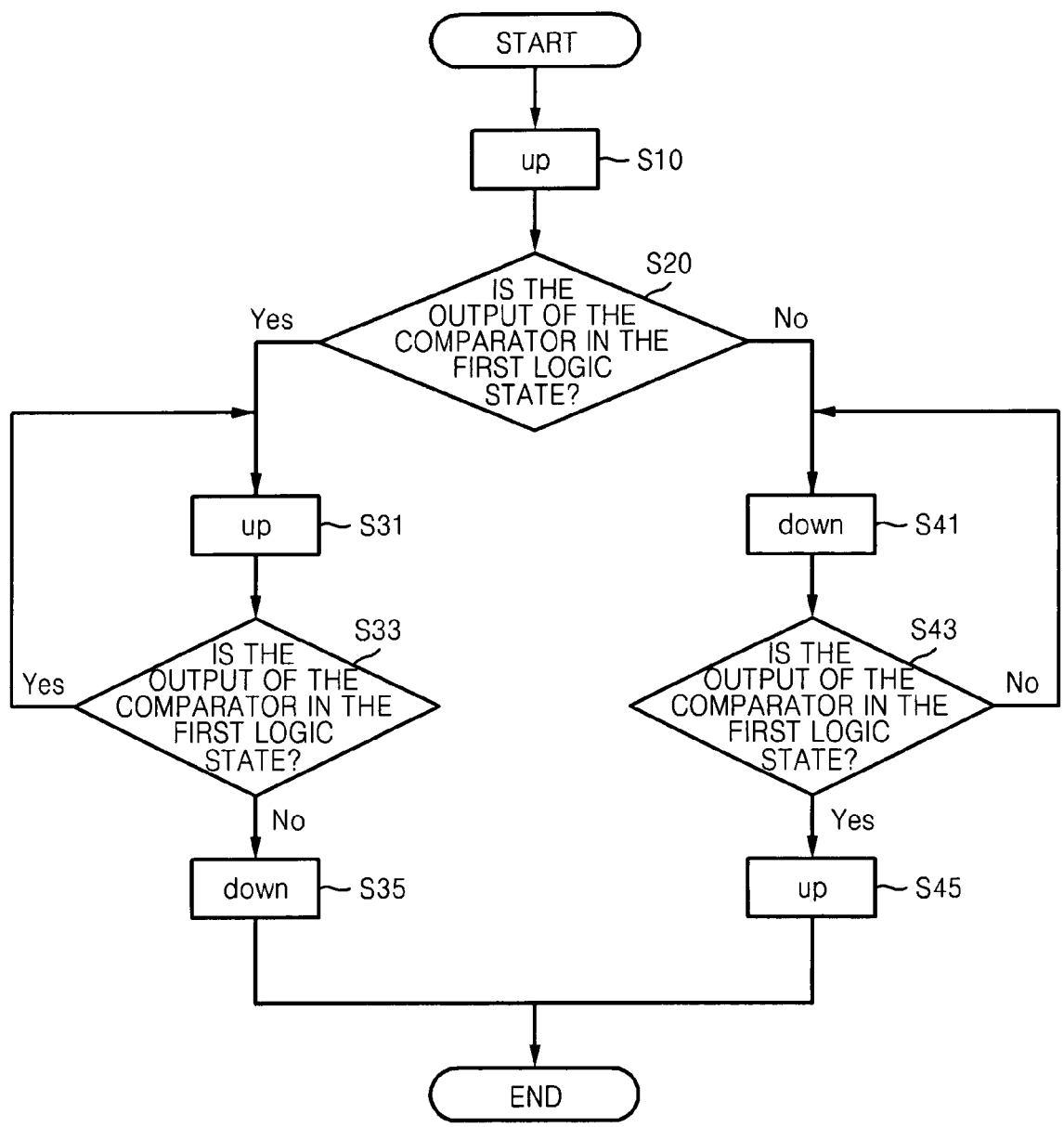
FIG. 7 shows a flowchart of steps performed by a code controller of FIG. 5 during calibration of the phase delay compensator in FIG. 5, according to an embodiment of the present invention.

The differentiator 144-1 differentiates the signal from the low pass filter 142-11 to generate the differentiated signal. The comparator 144-3 and the code controller 144-5 operate according to the flow-chart of FIG. 7 to determine the phase delay control code D-code. Referring to FIGS. 5, 6, and 7, the code controller 144-5 first increases the D-code from an initial value (step S10 of FIG. 7).

Then, the code controller 144-5 determines whether the output of the comparator 144-3 is at a first logic state (i.e., a high state) or at a second logic state (i.e., a low state) (step S20 of FIG. 7). Referring to FIG. 6, note that the output of the comparator 144-3 is at the first logic state if $\cos(\theta_{dt})$ is increasing and is at the second logic state if $\cos(\theta_{dt})$ is decreasing. The phase delay control code D-code is adjusted such that the phase difference $\theta_{dt}$ is changed by a step RS.

If the output of the comparator 144-3 is at the first logic state at step S20, the phase delay control code D-code is increased (step S31 of FIG. 7) such that the phase difference $\theta_{dt}$ is increased by a step RS. Thereafter, the code controller 144-5 determines whether the output of the comparator 144-3 is at the first logic state or the second logic state (step S33 of FIG. 7). If the output of the comparator 144-3 is at the first logic state at step S33, the phase delay control code D-code is further increased with a return to step S31.

Steps S33 and S31 are repeated until the output of the comparator 144-3 is at the second logic state when the phase delay control code D-code is decreased (step S35) such that the phase difference $\theta_{dt}$ is decreased by a step RS. At that point, the phase delay control code D-code for calibration of the delay compensator has been determined and is then stored into the second register 144-9.

Referring back to step S20 if the output of the comparator S20 is at the second logic state, the phase delay control code D-code is decreased (step S41 of FIG. 7) such that the phase difference $\theta_{dt}$ is decreased by the step RS. Thereafter, the code controller 144-5 determines whether the output of the comparator 144-3 is at the first logic state or the second logic state (step S43 of FIG. 7). If the output of the comparator 144-3 is at the second logic state at step S43, the phase delay control code D-code is further decreased with a return to step S41.

Steps S43 and S41 are repeated until the output of the comparator 144-3 is at the high logic state when the phase delay control code D-code is increased (step S45) such that the phase difference $\theta_{dt}$ is increased by a step RS. At that point, the phase delay control code D-code for calibration of the delay compensator has been determined and is then stored into the second register 144-9.

In this manner, note that the phase delay control code D-code is determined substantially near the point M3 when $\cos(\theta_{dt})$ is at a maximum in FIG. 6. In that case, the delay difference through the signal paths for the in-phase and quadrature-phase signals within the phase compensator 140 is minimized.

Figure 8:
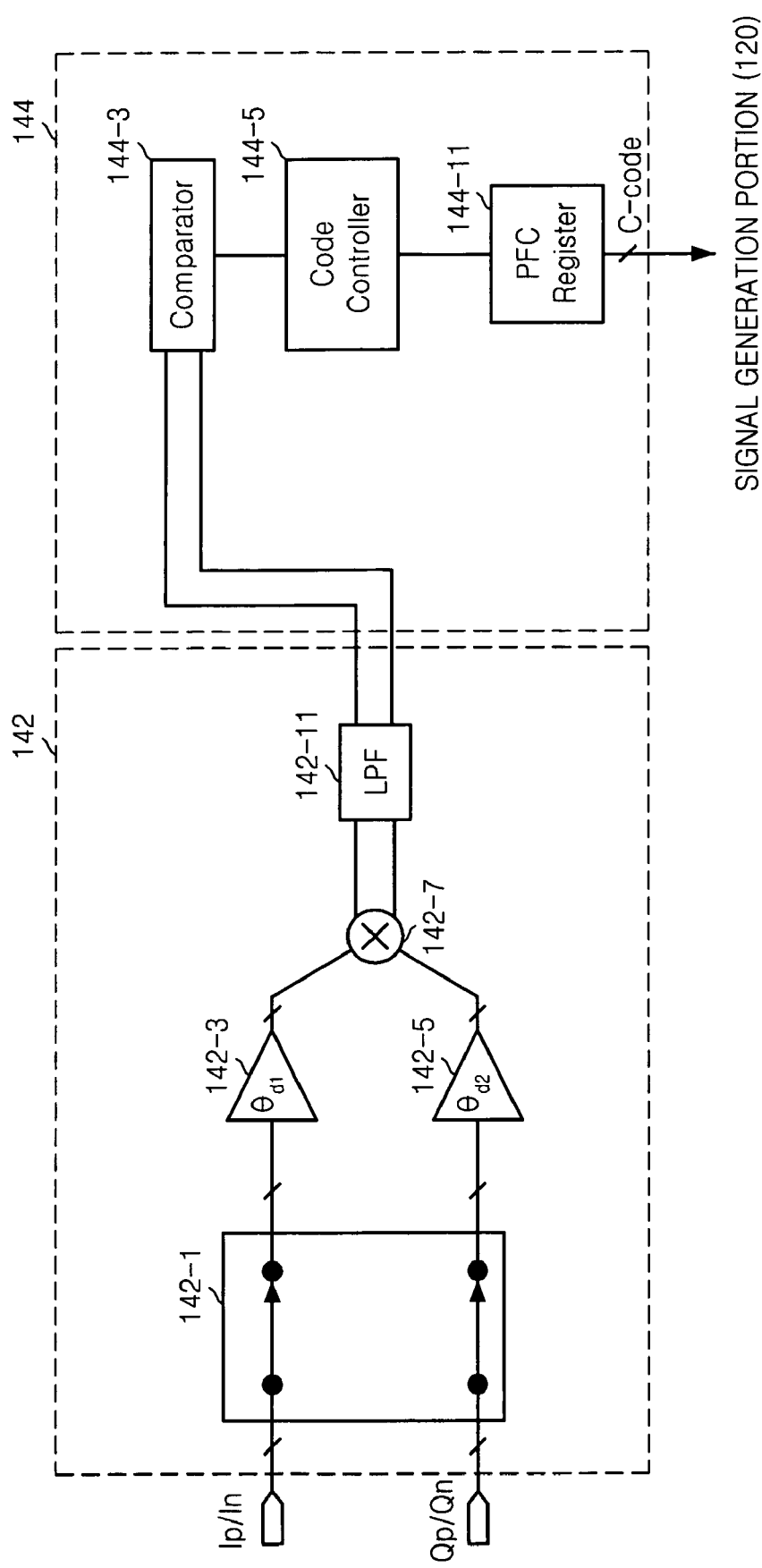
FIG. 8 is a block diagram showing configuration of the phase compensator of FIG. 3 during normal operation for phase error compensation, according to an embodiment of the present invention.

After calibration of the offset compensator and the delay compensator, the main controller 146 configures the phase compensator 140 as illustrated in FIG. 8 for normal operation of the phase compensator 140 for phase error compensation (step S55 in FIG. 11). In that case, the main controller 146 generates the first control signal C1 for controlling the switch portion 142-1 to couple the in-phase signal Ip and/or In to the first delay unit 142-3 and to couple the quadrature-phase signal Qp and/or Qn to the second delay unit 142-5.

In addition, the main controller 146 generates the second control signal C2 for controlling the first bypass switch 142-

9A to be open. Furthermore, the main controller 146 generates the third control signal C3 for controlling the second bypass switch 144-1A to be closed for bypassing the differentiator 144-1.

Note that during normal operation of the phase compensator 140 in FIG. 8, the first and second delays $\theta_{d2}$ and $\theta_{d1}$ of the first and second delay units 142-3 and 142-5 have been set according to the phase delay control code D-code from calibration of the delay compensator in step S54. In addition during such normal operation of the phase compensator 140 in FIG. 8, the offset compensation portion 142-9 has been set according to the offset control code O-code from calibration of the offset compensator in step S52.

Figure 9:
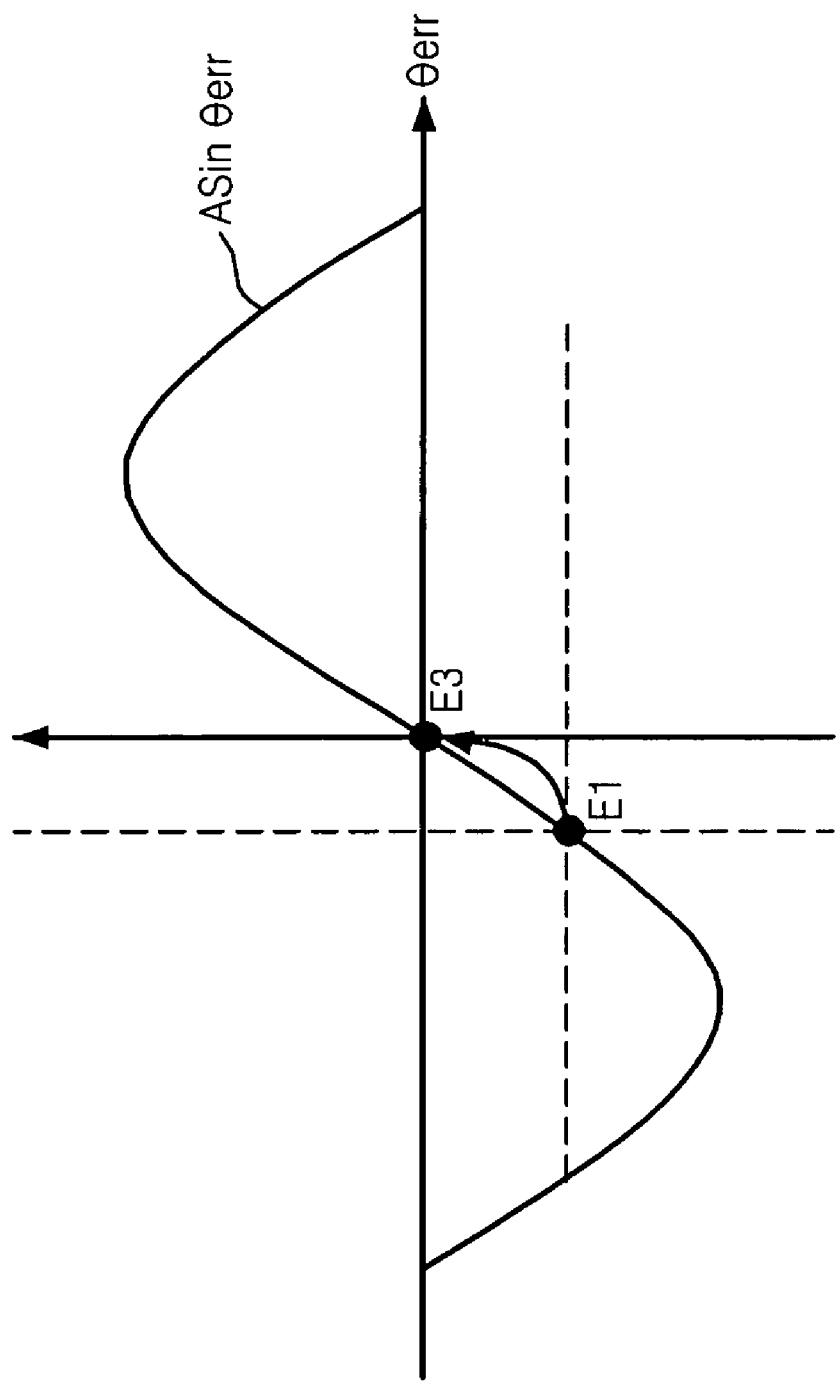
FIG. 9 shows an example functional plot used during normal operation of the phase compensator in FIG. 8, according to an embodiment of the present invention.

Assume that the in-phase signal Ip and/or In is expressed as cos(wt) and that the quadrature-phase signal Qp and/or Qn is expressed as $\sin(wt+\theta_{err})$ with $\theta_{err}$ being a phase error. The phase difference between the in-phase and quadrature-phase signals is desired to be 90°. The phase error $\theta_{err}$ indicates the level of deviation of the phase difference from the desired 90°. The mixer 142-7 mixes such signals cos(wt) and $\sin(wt+\theta_{err})$, and the offset compensation portion 142-9 adjusts the output of the mixer 142-7 to compensate for the offset voltage according to the offset control code O-code as stored in the first register 144-7. The low pass filter 142-11 filters the output of the offset compensation portion 142-9 to generate a signal expressed as $A \cdot \sin(\theta_{err})$ as illustrated in FIG. 9.

The output of the low pass filter 142-11 $A \cdot \sin(\theta_{err})$ is desired to be minimized such that the phase $\theta_{err}$ is removed to zero. The phase error code C-code is adjusted by the code controller 144-5 until the output of the low pass filter 142-11 $A \cdot \sin(\theta_{err})$ is minimized such as point E1 to E3 in FIG. 9 similarly as described with reference to FIG. 7 (step S56 in FIG. 11). The C-code of N bits with N being a natural number when the output of the low pass filter 142-11 $A \cdot \sin(\theta_{err})$ is minimized to remove the phase error $\theta_{err}$ is then stored into the third register 144-11.

In this manner, the offset voltage and the phase delay within the phase compensator 140 have been compensated during normal operation of the phase compensator 140 for phase error compensation of the in-phase and quadrature-phase signals. Thus, the signal generation apparatus generates the in-phase signal Ip and/or In and the quadrature-phase signal Qp and/or Qn having the desired phase difference of 90°.

Accordingly, the frequency converting apparatus 100 has enhanced signal-to-noise ratio and image compensation rate. Also, the receiver or transmitter including the frequency converting apparatus 100 in a communication system has an improved receiving or transmitting sensitivity.

While this invention has been particularly shown and described with reference to preferred embodiments thereof, it will be understood by those skilled in the art that various changes in form and details may be made therein without departing from the spirit and scope of the invention as defined by the appended claims.

The present invention is limited only as defined in the following claims and equivalents thereof.

What is claimed is:

1. A signal generation apparatus comprising:
    a signal generation portion for generating in-phase and quadrature-phase signals; and
    a phase compensator for generating a phase error control signal that maintains a phase difference between the in-phase and quadrature-phase signals, wherein the phase compensator includes:
        an offset compensator that is set to compensate for an offset voltage through said phase compensator; and
        a delay compensator that is set to compensate for a difference of delays through paths for the in-phase and quadrature-phase signals within said phase compensator.

2. The signal generation apparatus of claim 1, wherein the phase compensator includes:
    a first delay unit for providing a first delay to the in-phase signal;
    a second delay unit for providing a second delay to the quadrature-phase signal;
    a switch portion; and
    a main controller that controls the switch portion to selectively couple or uncouple each of the in-phase and quadrature-phase signals to the first and second delay units depending on each of a plurality of modes of operation of the signal generation apparatus.

3. The signal generation apparatus of claim 2, wherein the modes of operation include calibration of the delay compensator, calibration of the offset compensator, and normal operation of the phase compensator.

4. The signal generation apparatus of claim 3, wherein the phase compensator further includes:
    a first register for storing an offset control code determined during the calibration of the offset compensator, with the offset control code being used to compensate for the offset voltage through said phase compensator;
    a second register for storing a phase delay control code determined during the calibration of the delay compensator, with the phase delay control code being used to compensate for the difference of the delays through the paths for the in-phase and quadrature-phase signals within said phase compensator; and
    a third register for storing a phase error control code determined during normal operation of the phase compensator, the phase error control code being used to maintain the phase difference between the in-phase and quadrature-phase signals.

5. The signal generation apparatus of claim 1, wherein the delay compensator includes:
    a first delay unit for providing a first delay to the in-phase signal;
    a second delay unit for providing a second delay to the quadrature-phase signal;
    and wherein the signal generation apparatus further includes:
    a code controller that sets a phase delay control code for determining at least one of the first and second delays for minimizing the difference of the delays through the paths for the in-phase and quadrature-phase signals within said phase compensator.

6. The signal generation apparatus of claim 5, wherein the signal generation apparatus further includes:
    a switch portion that selectively couples a same one of the in-phase and quadrature-phase signals through the first and second delay units during calibration of the delay compensator;
    a mixer that mixes outputs from the first and second delay units to generate a mixed signal;
    a low-pass filter for filtering the mixed signal to generate a filtered signal;
    a differentiator for differentiating the filtered signal to generate a differentiated signal; and
    a comparator for comparing the differentiated signal to a desired delay level;

wherein the code controller adjusts the phase delay control code for adjusting at least one of the first and second delays until the differentiated signal is at the desired delay level.

7. The signal generation apparatus of claim 6, wherein the first and second delay units, the code controller, the switch portion, the mixer, the low-pass filter, the differentiator, and the comparator are disposed within the phase compensator.

8. The signal generation apparatus of claim 1, wherein the offset compensator includes:
   a first signal path for transmitting the in-phase signal in the phase compensator;
   a second signal path for transmitting the quadrature-phase signal in the phase compensator; and
   an offset compensation unit that adjusts a combination of signals from the first and second signal paths according to an offset control code that is set to minimize an effect of the offset voltage through the first and second signal paths.

9. The signal generation apparatus of claim 8, further including:
   a first delay unit that is the first signal path for transmitting the in-phase signal with a first delay;
   a second delay unit that is the second signal path for transmitting the quadrature-phase signal with a second delay;
   a switch portion that uncouples the in-phase and quadrature-phase signals from the first and second delay units during calibration of the offset compensator;
   a mixer that mixes outputs from the first and second delay units to generate a mixed signal;
   wherein the offset compensation unit adjusts the mixed signal according to the offset control code to generate an offset compensated signal;
   a low-pass filter for filtering the offset compensated signal to generate a filtered signal;
   a comparator for comparing the filtered signal to a desired offset level; and
   a code controller that adjusts the offset control code until the filtered signal is at the desired offset level.

10. The signal generation apparatus of claim 9, wherein the first and second delay units, the offset compensation unit, the switch portion, the mixer, the low-pass filter, the comparator, and the code controller are disposed within the phase compensator.

11. The signal generation apparatus of claim 1, further comprising:
   a first delay unit for providing a first delay to the in-phase signal;
   a second delay unit for providing a second delay to the quadrature-phase signal;
   wherein the first and second delays are set for minimizing the difference of the delay between the in-phase and quadrature-phase signals through the phase compensator;
   a switch portion that couples the in-phase signal to the first delay unit and that couples the quadrature-phase signal to the second delay unit for normal operation of the phase compensator;
   a mixer that mixes outputs from the first and second delay units to generate a mixed signal;
   a offset compensation unit that adjusts the mixed signal to generate an offset compensated signal for minimizing an effect of the offset voltage through the first and second delay units;
   a low-pass filter for filtering the offset compensated signal to generate a filtered signal;
   a comparator for comparing the filtered signal to a desired phase difference level; and
   a code controller that adjusts the phase error control signal for adjusting the phase difference between the in-phase and quadrature-phase signals until the filtered signal is at the desired phase difference level.

12. The signal generation apparatus of claim 11, wherein the first and second delay units, the switch portion, the mixer, the offset compensation unit, the low-pass filter, the comparator, and the code controller are disposed within the phase compensator.

13. The signal generation apparatus of claim 11, further comprising:
   an oscillator for generating an oscillating signal; and
   a signal generation portion for using the oscillating signal to generate the in-phase and quadrature-phase signals having the phase difference according to the phase error control signal.

14. The signal generation apparatus of claim 1, wherein the in-phase and quadrature-phase signals are used for frequency conversion of a radio frequency input signal in a communication system.

15. A frequency converting apparatus in a communication system, the frequency converting apparatus comprising:
   a signal generation apparatus for generating an in-phase signal and a quadrature-phase signal;
   a first mixer for mixing the in-phase signal with an input signal to generate an in-phase intermediate frequency signal; and
   a second mixer for mixing the quadrature-phase signal with the input signal to generate a quadrature-phase intermediate frequency signal;
   wherein the signal generation apparatus includes:
   a signal generation portion for generating the in-phase and quadrature-phase signals from an oscillating signal; and
   a phase compensator for generating a phase error control signal that maintains a phase difference between the in-phase and quadrature-phase signals, wherein the phase compensator includes:
      an offset compensator that is set to compensate for an offset voltage through said phase compensator; and
      a delay compensator that is set to compensate for a difference of delays through paths for the in-phase and quadrature-phase signals within said phase compensator.

16. The frequency converting apparatus of claim 15, wherein the phase compensator includes:
   a first delay unit for providing a first delay to the in-phase signal;
   a second delay unit for providing a second delay to the quadrature-phase signal;
   a switch portion; and
   a main controller that controls the switch portion to selectively couple or uncouple each of the in-phase and quadrature-phase signals to the first and second delay units depending on each of a plurality of modes of operation of the signal generation apparatus.

17. The frequency converting apparatus of claim 16, wherein the modes of operation includes calibration of the delay compensator, calibration of the offset compensator, and normal operation of the phase compensator.

18. The frequency converting apparatus of claim 17, wherein the phase compensator further includes:
   a first register for storing an offset control code determined during the calibration of the offset compensator, with the offset control code being used to compensate for the offset voltage through said phase compensator;

a second register for storing a phase delay control code determined during the calibration of the delay compensator, with the phase delay control code being used to compensate for the difference of delays through the paths for the in-phase and quadrature-phase signals within said phase compensator; and a third register for storing a phase error control code determined during normal operation of the phase compensator, the phase error control code being used to maintain the phase difference between the in-phase and quadrature-phase signals.

19. The frequency converting apparatus of claim 15, wherein the signal generation apparatus further includes:
   an oscillator for generating the oscillating signal, wherein the signal generation portion uses the oscillating signal to generate the in-phase and quadrature-phase signals having the phase difference according to the phase error control signal.

20. The signal generation apparatus of claim 15, wherein the input signal is a radio frequency (RF) input signal in the communication system.

\* \* \* \* \*